(12) United States Patent
Lee et al.

(10) Patent No.: US 8,554,739 B2
(45) Date of Patent: Oct. 8, 2013

(54) SYSTEMS AND METHODS FOR IED DESIGN TEMPLATES

(75) Inventors: Tony J. Lee, Pullman, WA (US); Craig Thompson, Pullman, WA (US)

(73) Assignee: Schweitzer Engineering Laboratories Inc., Pullman, WA (US)

( * ) Notice: Subject to any disclaimer, the term of this patent is extended or adjusted under 35 U.S.C. 154(b) by 187 days.

(21) Appl. No.: 13/006,212

(22) Filed: Jan. 13, 2011

(65) Prior Publication Data
US 2012/0185436 A1 Jul. 19, 2012

(51) Int. Cl.
| | |
|---|---|
| *G06F 17/00* | (2006.01) |
| *G06F 13/00* | (2006.01) |
| *G06F 3/00* | (2006.01) |
| *G06F 9/44* | (2006.01) |
| *G06F 15/16* | (2006.01) |
| *G06F 1/00* | (2006.01) |
| *G09G 5/02* | (2006.01) |
| *G09G 5/00* | (2006.01) |

(52) U.S. Cl.
CPC ............... *G06F 17/00* (2013.01); *G06F 13/00* (2013.01); *G06F 3/00* (2013.01)
USPC ........... 707/668; 707/670; 707/694; 711/161; 715/748; 717/125; 709/203; 709/213; 713/1; 713/300; 345/594; 345/619; 345/650

(58) Field of Classification Search
CPC ...................................................... G06F 17/30
USPC ........... 713/1, 300; 324/110; 703/18; 702/62; 370/338, 254; 709/203, 206, 213; 707/695, 672, 665–671, 654, 694; 711/161–162; 715/738, 740, 748; 717/105, 125; 345/594, 619, 650, 661
See application file for complete search history.

(56) References Cited

U.S. PATENT DOCUMENTS 5,963,734 A * 10/1999 Ackerman et al. ............... 703/18
6,496,927 B1 * 12/2002 McGrane et al. ................. 713/1

(Continued)

FOREIGN PATENT DOCUMENTS

WO      WO 00/73866        * 12/2000
WO      WO 2010/150048     * 12/2010

OTHER PUBLICATIONS

Bringing Security to Utility Industry using Novel Intrusion Detection & Prevention System: ADEC-G, Copyright © 2013. Applied Communication Sciences., 2 pages.*

(Continued)

*Primary Examiner* — Srirama Channavajjala
(74) *Attorney, Agent, or Firm* — Jared L. Cherry

(57) ABSTRACT

Disclosed herein are a variety of systems and methods that may be utilized to facilitate the configuration of intelligent electronic devices using design templates. A design template may be configured to make available to the user only particular inputs that might need to be modified for a specific application of the intelligent electronic device. Use of templates, as disclosed herein, may simplify the task of configuring an intelligent electronic device. Data entered by the user may be utilized to generate a plurality of intelligent electronic device settings. According to various embodiments, the data entered by a user may be stored on the intelligent electronic device in an archive file. The archive file may also include other design information that a user may desire to store on the intelligent electronic device.

4 Claims, 6 Drawing Sheets

(56) References Cited

U.S. PATENT DOCUMENTS

| | | | |
|---|---|---|---|
| 6,618,736 B1 * | 9/2003 | Menage | 1/1 |
| 7,127,328 B2 * | 10/2006 | Ransom | 700/286 |
| 7,383,327 B1 * | 6/2008 | Tormasov et al. | 709/220 |
| 7,447,760 B2 * | 11/2008 | Forth et al. | 709/223 |
| 8,165,841 B2 * | 4/2012 | Vetter et al. | 702/122 |
| 2004/0138786 A1 * | 7/2004 | Blackett et al. | 700/295 |
| 2005/0097373 A1 * | 5/2005 | Stoupis et al. | 713/300 |
| 2006/0056370 A1 * | 3/2006 | Hancock et al. | 370/338 |
| 2006/0116794 A1 | 6/2006 | Stoupis | |
| 2006/0230394 A1 | 10/2006 | Forth | |
| 2008/0034019 A1 * | 2/2008 | Cisler et al. | 707/204 |
| 2008/0234957 A1 | 9/2008 | Banhegyesi | |
| 2008/0235355 A1 * | 9/2008 | Spanier et al. | 709/219 |
| 2008/0312851 A1 * | 12/2008 | Kagan et al. | 702/60 |
| 2010/0054276 A1 * | 3/2010 | Wang et al. | 370/463 |
| 2010/0205418 A1 | 8/2010 | Kishan | |
| 2012/0185436 A1 * | 7/2012 | Lee et al. | 707/640 |
| 2012/0303299 A1 * | 11/2012 | Banhegyesi | 702/61 |

OTHER PUBLICATIONS

ChenWei Yang et al., "Programmable Logic for IEC 61850 Logical Nodes by means of IEC 61499", IEEE 37th International Conference of Industrial Electronics Society (IECON"11), Nov. 7-10, 2011, pp. 1-7.*

* cited by examiner

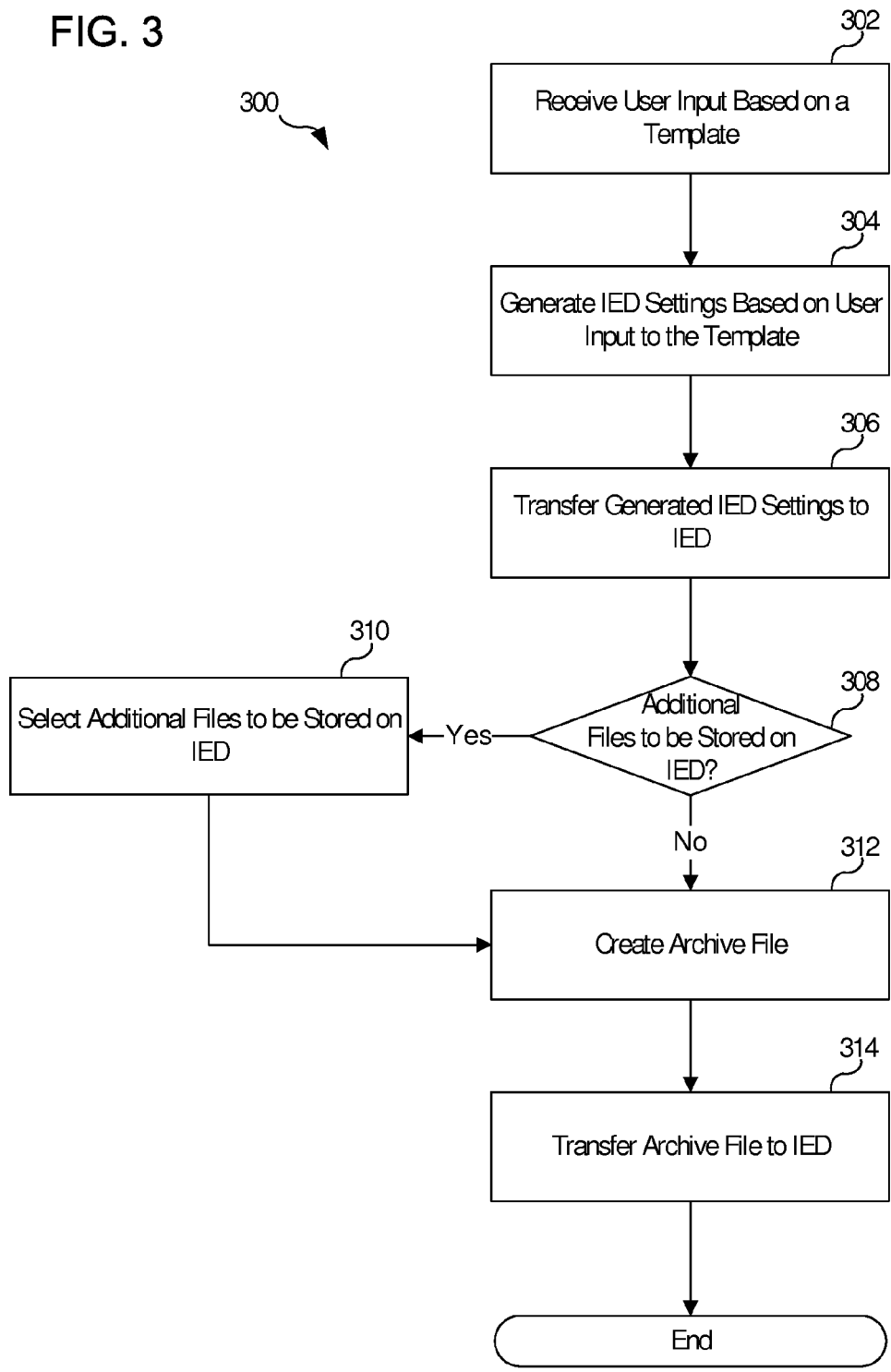

SYSTEMS AND METHODS FOR IED DESIGN TEMPLATES

BRIEF DESCRIPTION OF THE DRAWINGS

FIG. 3 illustrates one embodiment of a method for generating settings for a particular IED based on user input to a template and for storing the user input to the template in an archive file stored on the IED.

DETAILED DESCRIPTION OF PREFERRED EMBODIMENTS

Figure 1:
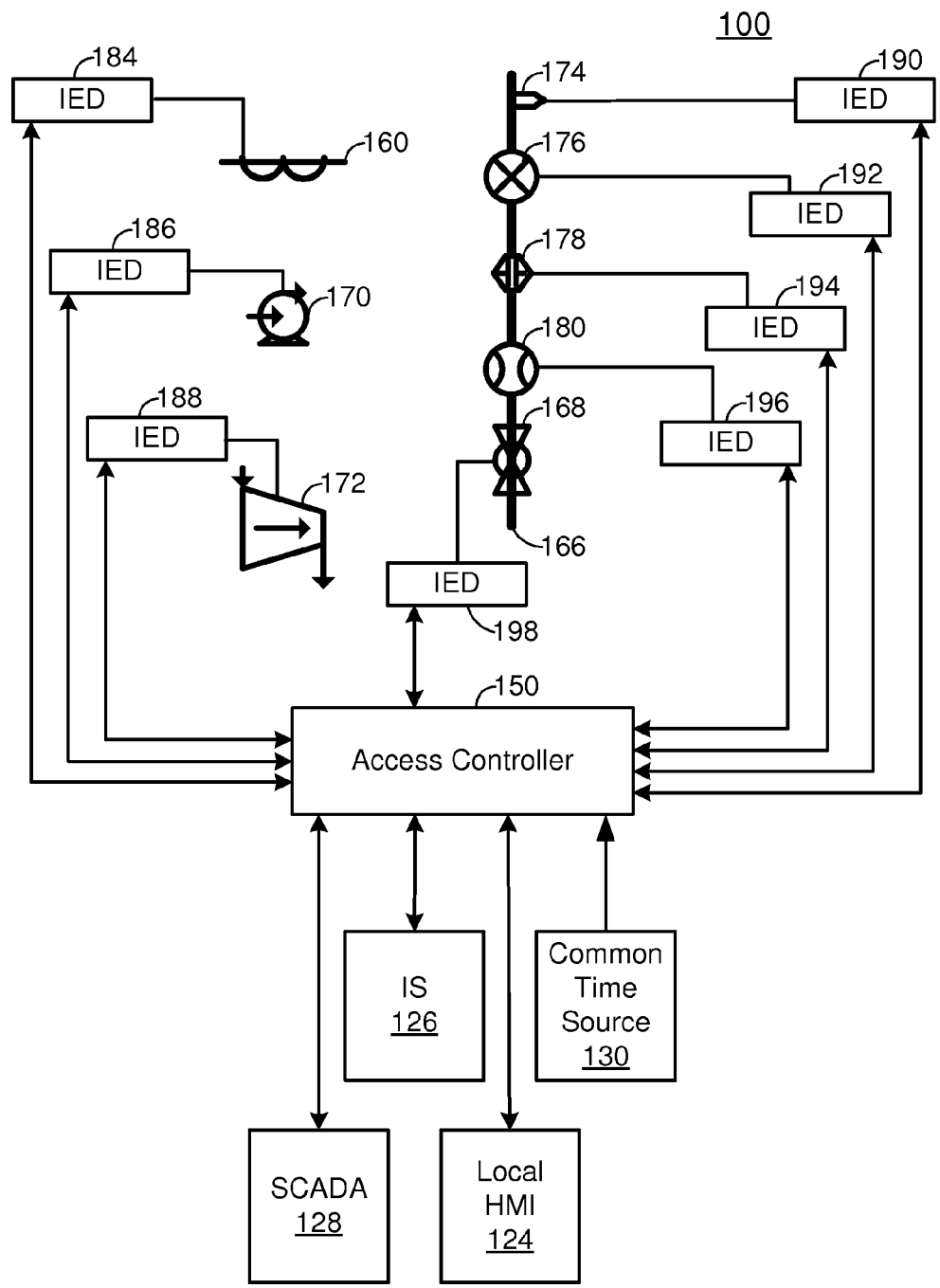
FIG. 1 illustrates one embodiment of a protection, control, automation, and/or monitoring system.

Modern automation, electric power transmission, and distribution systems typically include intelligent electronic devices ("IEDs") for protection, control, automation, and/or monitoring of equipment in the system. IEDs may be used to monitor equipment of many types, including electric transmission lines, electric distribution lines, current transformers, buses, switches, circuit breakers, reclosers, transformers, autotransformers, tap changers, voltage regulators, capacitor banks, generators, motors, pumps, compressors, valves, and a variety of other types of monitored equipment. In view of the wide variety of configurations in which an IED may be used and the wide variety of tasks that an IED may be configured to perform, many IEDs may include a large number of user-configurable settings. While the wide array of user-configurable settings may allow for considerable flexibility in the use of an IED, the large number of user-configurable settings may also complicate the task of configuring an IED. For example, a user who is unfamiliar with a particular function of each of the user-configurable settings may incorrectly configure an IED for its intended purpose. This incorrect configuration may result in undesired operation or unnecessary expense associated with correcting the configuration.

Disclosed herein are a variety of systems and methods that may be utilized to facilitate the configuration of IEDs using design templates. A design template may be configured to make available to the user only particular settings that might need to be modified for a specific application of the IED. Use of templates, as disclosed herein, may simplify the task of configuring an IED. Data entered by the user may be utilized to generate a plurality of IED settings. According to various embodiments, the data entered by a user may be stored on the IED in an archive file. The archive file may also include other design information that a user may desire to store on the IED.

As the term is used herein, an Intelligent Electronic Device ("IED") refers to any microprocessor-based device that monitors, controls, automates, and/or protects monitored equipment within an electric power delivery system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, motor drives, and the like. IEDs gather status information from one or more pieces of monitored equipment. IEDs may receive information concerning monitored equipment using sensors, transducers, actuators, and the like. IEDs may be configured to monitor and communicate information, such as voltages, currents, equipment status, temperature, frequency, pressure, density, infrared absorption, radio-frequency information, partial pressures, viscosity, speed, rotational velocity, mass, switch status, valve status, circuit breaker status, tap status, meter readings, and the like. IEDs may also be configured to communicate calculations, such as phasors (which may or may not be synchronized as synchrophasors), events, fault distances, differentials, impedances, reactances, frequency, and the like. IEDs may also communicate settings information, IED identification information, communications information, status information, alarm information, and the like.

The embodiments of the disclosure will be best understood by reference to the drawings, wherein like parts are designated by like numerals throughout. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures, or operations are not shown or described in detail. Furthermore, the described features, structures, or operations may be combined in any suitable manner in one or more embodiments. It will also be readily understood that the components of the embodiments, as generally described and illustrated in the figures herein, could be arranged and designed in a wide variety of different configurations.

Several aspects of the embodiments described will be illustrated as software modules or components. As used herein, a software module or component may include any type of computer instruction or computer executable code located within a memory device that is operable in conjunction with appropriate hardware to implement the programmed instructions. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment, where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product, including a machine-readable storage medium having stored thereon instructions that may be used to program a computer (or other electronic device) to perform processes described herein. The machine-readable storage medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic instructions.

FIG. 1 illustrates one embodiment of a protection, control, automation, and/or monitoring system 100. As illustrated, various pieces of monitored equipment are in communication with various IEDs. For example, an electric power conductor 160 is monitored by IED 184. IED 184 may be configured to monitor the voltage, current, impedance, reactance, phase, or frequency associated with electronic power conductor 160. IED 186 may be configured to receive information from a pump 170. IED 186 may monitor pressure, temperature, shaft rotational velocity, flow rate, and/or pump status (e.g., on/off), and the like. IED 188 is illustrated as monitoring a compressor 172. IED 188 may receive information about conditions in the compressor from sensors in the compressor or status of the compressor itself. Further illustrated are IEDs 190, 192, 194, 196, and 198, each of which is in communication with a sensor or other equipment placed on flow system 166 through which a fluid may be flowing. Various sensors and equipment may be placed on flow system 166, such as valve 168, flow meter 180, IR absorption sensor 178, pressure transducer 176, and temperature transducer 174.

In the illustrated embodiment, each IED is in communication with an access controller 150. Access controller 150 may be configured to receive information from various IEDs and communicate the information to a central monitoring system, such as SCADA system 128, and to information system 126. Access controller 150 may also be in communication with local human-machine interface (HMI) 124. Local HMI 124 may be located at the same substation as access controller 150. Local HMI 124 may be used to view data from access controller 150 and/or initiate communications with access controller 150 to change settings, issue control instructions, retrieve an event (fault) report, retrieve data, and the like. Access controller 150 may further receive input from common time source 130. Information regarding a common time provided by common time source 130 may be distributed to various IEDs in system 100.

As illustrated in FIG. 1, IEDs may be utilized in a wide variety of circumstances to perform various tasks and monitor a variety of types of equipment. In order to accommodate this wide variety of tasks, many IEDs include a relatively large number of user-customizable settings. In order to facilitate the configuration of IEDs, a template may be provided into which a user can input data regarding the task to be performed by an IED. The template may be associated with logic equations and numeric equations for generating IED settings based on the data provided by the user using the template.

Figure 2A:
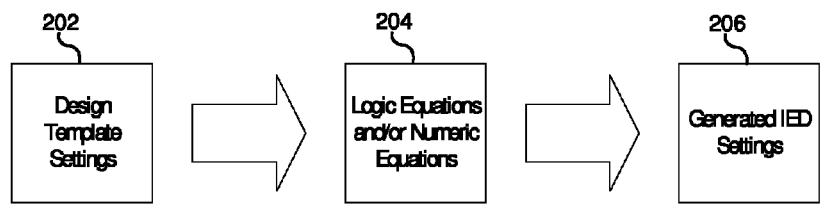
FIG. 2A illustrates a conceptual process of one embodiment for generating IED settings using design template settings and logic equations.
Figure 2B:
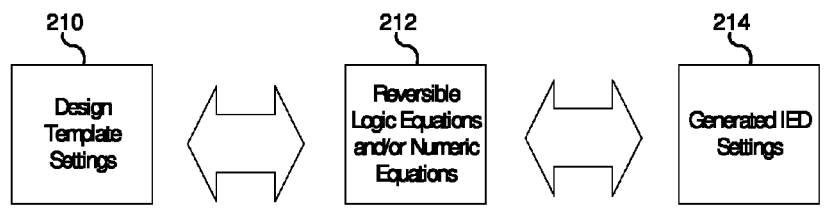
FIG. 2B illustrates a conceptual process of one embodiment for generating IED settings using design template settings and reversible logic equations.
Figure 2C:
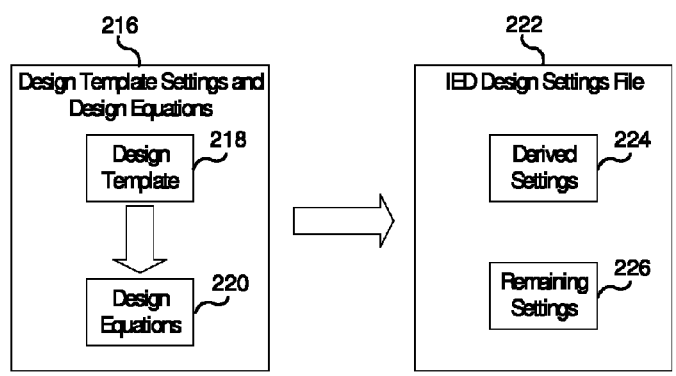
FIG. 2C illustrates a conceptual process for generating an IED design settings file using design template settings and design equations.

FIGS. 2A, 2B, and 2C illustrate conceptual processes for generating IED settings using design templates. In FIG. 2A, a user may enter design template settings at 202, which may be inputs at 204 to logic equations and/or numeric equations. The logic equations and/or numeric equations may generate IED settings 206 based on the user supplied data. As illustrated in FIG. 2A, the process is a one-way process. In other words, the logic equations and/or numeric equations may not allow for regeneration of template settings based on generated IED settings.

In contrast, the process illustrated in FIG. 2B relies on reversible logic equations and/or numeric equations. Accordingly, at 210, a user may enter design template settings, which may be inputs at 212 to reversible logic equations and/or numeric equations. Reversible logic equations and/or numeric equations may generate IED settings at 214. While design equations utilized in generation of IED settings may be reversible in some circumstances, it may not always be practical to utilize reversible design equations; however, even in applications where reversible logic equations are not used, a user may desire to refer to the template settings originally used in configuring an IED.

FIG. 2C illustrates a scenario in which design template settings and design equations 216 may be utilized to generate an IED settings file 222. The scenario illustrated in FIG. 2C may be utilized, for example, where a design template 218 and design equations 220 operate on a computer system that is separate from an IED that may utilize IED settings file 222. As described above, design template 218 may solicit from a user information regarding a specific configuration and/or tasks to be performed by an IED. Based on the information gathered using design template 218, design equations 220 may be utilized to generate IED design settings file 222. Design settings and design equations 216 may be comprised within a software system configured to generate settings for a wide variety of IEDs. For example, the AcSELerator® suite available from Schweitzer Engineering Laboratories, Inc., Pullman, Wash., allows a user to configure a wide variety of IEDs manufactured by Schweitzer Engineering Laboratories, Inc. using design templates.

In the illustrated embodiment, IED design settings file 222 comprises derived settings 224 and remaining settings 226. While some device settings are calculated from/using design equations 220, other settings may not be affected by design template 218. Remaining settings 226 may, according to various embodiments, comprise default values or other values that may not affect the operation of an IED for the particular task to be performed by the IED. Once IED design settings file 222 has been generated, it may be transferred to an IED.

FIG. 3 illustrates one embodiment of a method 300 for generating settings for a particular IED based on user input to a template and for storing the user input to the template in an archive file saved on the IED. At 302, user input may be received based on a template. The template may prompt a user to provide specific information about the circumstances and/or environment in which a particular IED is to be used. At 304, IED settings may be generated based on user input to the template. The settings generated at 304 may be transferred to the IED at 306.

In addition to storing the user input to the template in an archive file, according to various embodiments, additional design files may also be stored on the IED. A variety of types of additional information may be stored on the IED, including but not limited to design documents, schematics, additional configuration information, notes regarding maintenance or other issues, and the like. At 308, it may be determined whether a user desires to store additional files on the IED. If so, at 310, a user may select additional files to be stored on the IED. At 312, an archive file may be created containing a user input to the templates and any additional files selected by the user. According to various embodiments, the archive file may be "zipped" or otherwise formatted such that multiple files of various types may be combined into a single file. In other embodiments, an archive file may be compressed or uncompressed, encrypted or unencrypted, or may be otherwise electronically protected. According to various embodiments, in addition to the user input to a template, the archive file may also include a copy of the template, the logic equations utilized to generate the IED settings, the generated IED settings, the previous IED settings, the date and time that the generated settings are created, or other information.

The archive file may be transferred to the IED, at 314. According to various embodiments, the IED may be configured to store the archive file in a computer-readable storage medium. According to various embodiments, the archive file may be transferred to the IED using a variety of physical media and data communication protocols. For example, physical media may include Ethernet, RS-232, universal serial bus (USB), IEEE 1394, removable storage media (e.g., a computer-readable disc), and the like. According to various embodiments, transfer of the archive file to the IED may be performed automatically (e.g., without user intervention). Such embodiments may further the consistent practice of storing data entered by a user in a template on an IED configured using the template.

Figure 4:
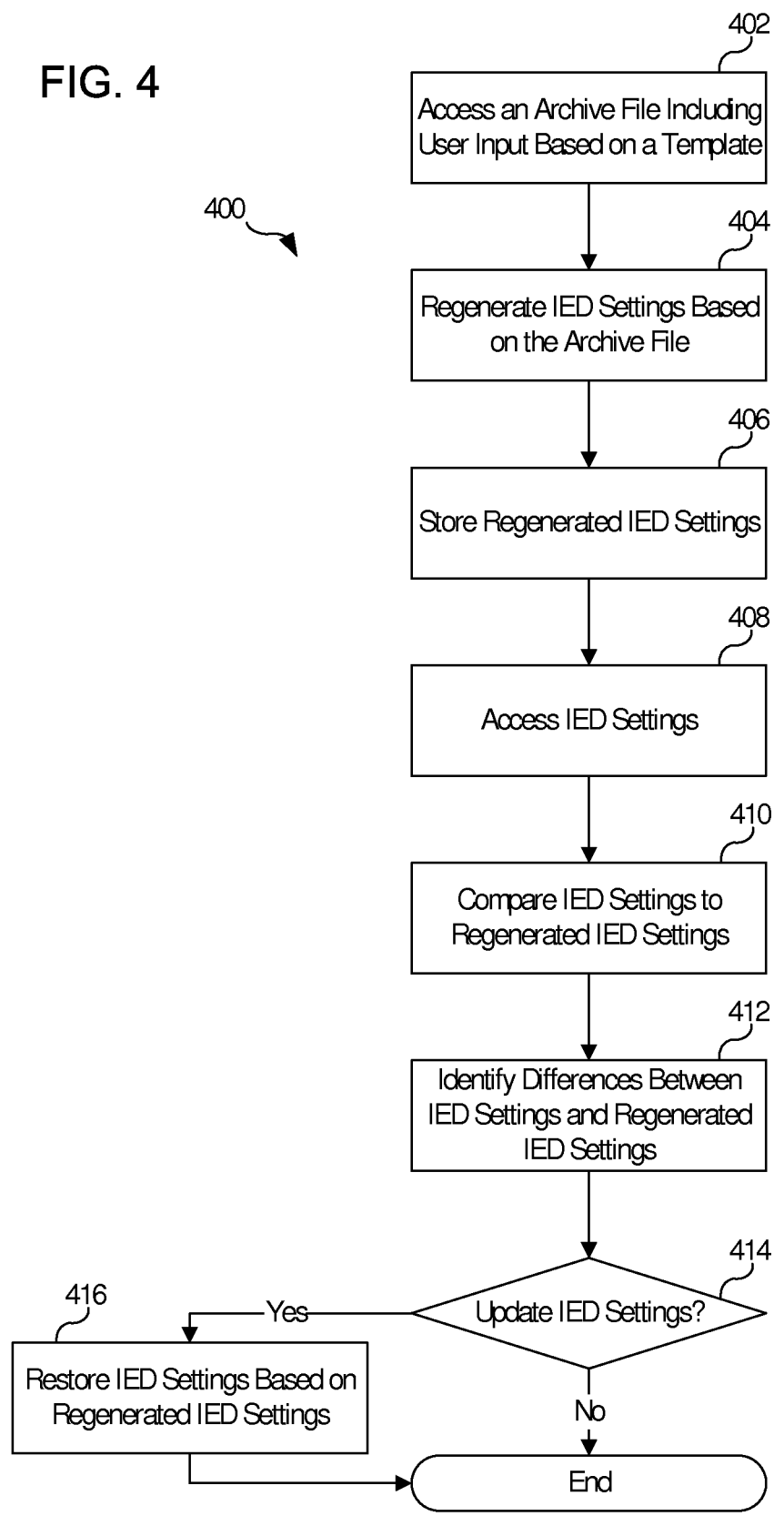
FIG. 4 illustrates one embodiment of a method for comparing IED settings to settings generated based on an archive file stored on an IED.

FIG. 4 illustrates one embodiment of a method 400 for comparing IED settings to settings generated based on an archive file. As discussed above, an archive file containing user data entered into a template used to generate IED settings may be stored on the IED. At some later time, a user may desire to access the archive file. Further, the user may desire to identify any differences between settings based on the archive file and current IED settings, and may further desire to restore the IED settings based on the archive file. At 402, the archive file including user input based on a template may be accessed. IED settings based on the archive file may be regenerated at 404, and the regenerated IED settings may be stored at 406.

The IED settings may be accessed at 408 for comparison with the regenerated IED settings. Comparison of the IED settings to the regenerated IED settings may occur at 410. At 412, the differences between the IED settings and the regenerated IED settings may be identified. Identifying the differences may include, for example, generating a report indicating which settings have been changed. According to various embodiments, the report may comprise an indication of the value of each IED setting and the regenerated value of each altered setting.

According to various embodiments, at 414, a user may be given the option of updating the IED settings based on the regenerated IED settings. Restoring IED settings based on the regenerated IED settings may provide a convenient mechanism for reverting any changes to the IED settings that may have been made without utilizing the IED template. This feature may, for example, be used as one possible strategy for troubleshooting problems associated with an IED. If a user chooses to update the IED settings at 414, the regenerated IED settings may be restored at 416.

Figure 5:
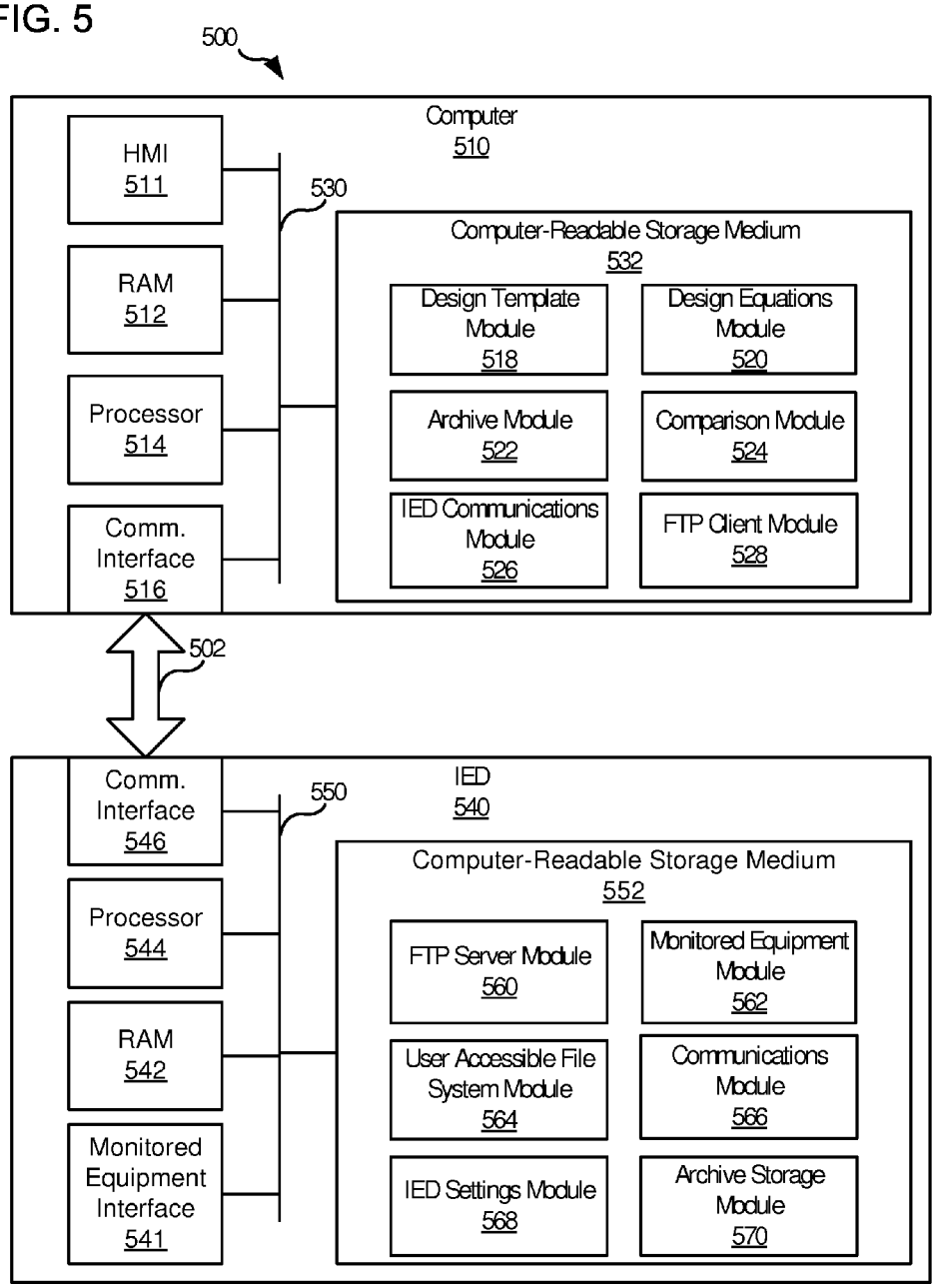
FIG. 5 is a functional block diagram of one embodiment of a system that may be utilized to configure an IED using a computer programmed with design templates.

FIG. 5 is a functional block diagram of one embodiment of a system 500 that includes a computer 510 and an IED 540. Computer 510 and IED 540 are in electrical communication with one another by way of data link 502 and communications interfaces 516 and 546. Data Link 502 may facilitate the transfer of data between computer 510 and IED 540. Data link 502 may comprise a variety of physical communication media, including but not limited to RS-232, Ethernet, IEEE 1394, universal serial bus, and the like. According to various embodiments, data link 502 may comprise a network (e.g., a local area network, a wide area network, a private network, a wireless network, or the Internet). A variety of data communication protocols may also be utilized in order to facilitate the transfer of data between computer 510 and IED 540.

Computer 510 includes a data bus 530 that links communications interface 516, a processor 514, RAM 512, a human-machine interface 511, and a computer-readable storage medium 532. In conjunction with executable instructions stored on computer-readable storage medium 532, processor 514 may be configured to implement the functions, algorithms, and calculations described herein. Processor 514 may be embodied as a general purpose integrated circuit, an application specific integrated circuit, a field-programmable gate array, microprocessor and other programmable logic devices. Processor 514 may further be configured to process communications received via communications interface 516 and human-machine interface 511. HMI 511 may encompass a wide range of human-machine interface devices, such as a display screen, keyboard, mouse, and the like.

Computer-readable storage medium 532 may be the repository of various modules configured to perform any of the features described herein, and more specifically to implement the functionality of configuring IED 540 using a design template and storing design information (e.g., data entered by a user in the design template) in an archive file on IED 540. According to the illustrated embodiment, computer-readable storage medium 532 comprises a design template module 518, a design equations module 520, archive module 522, a comparison module 524, an IED communications module 526, and an FTP client module 528.

Design template module 518 may incorporate a variety of design templates configured to elicit from a user data that may be utilized to configure IEDs to perform a wide variety of tasks. Design template module 518 may provide data elicited from a user to design equations module 520, which may generate a number of IED settings based upon the data provided by the user.

Archive module 522 may be configured to generate an archive file to be stored on IED 540. In various embodiments, the archive file may comprise design information associated with IED 540 and/or other equipment. According to various embodiments, archive module 522 may be configured to generate a single file comprising a plurality of individual files. According to various embodiments, an archive file may include one or more of: user input to a design template, the design template used to configure IED 540, logic equations utilized to generate IED settings based on the user input to the design template, the IED settings generated based on the user input and a logic equation, previous IED settings, an indicator of the date and time that the generated settings are created, and the like.

Comparison module 524 may be configured to compare IED settings to settings regenerated based on an archive file with IED settings retrieved from IED 540. Comparison module 524, according to one specific embodiment, may be configured to implement method 400, which is illustrated in FIG. 4 and described above. Further, according to various embodiments, comparison module 524 may generate a report identifying differences between the retrieved IED settings and the settings regenerated based on an archive file.

IED communications module 526 may be configured to interact with IED 540, in order to provide data to IED 540 or receive data from IED 540. IED communications module 526 may be configured to transfer IED settings generated by design equations module 520 to IED 540. Further IED communications module 526 may be configured to interrogate existing settings of IED 540 and provide such settings to comparison module 524. In addition, IED communications module 526 may provide for communication of data between IED 540 and computer 510, including data regarding monitored equipment in communication with IED 540.

FTP client module 528 may be configured to interact with an FTP server module 560 resident on IED 540 and to transfer data to or from a user-accessible file system. According to various embodiments, FTP client module 528 may be configured to implement any number of file transfer protocols.

IED 540 includes a data bus 550 that links communications interface 546, a processor 544, RAM 542, a monitored equipment interface 541, and a computer-readable storage medium 552. In conjunction with executable instructions stored on computer readable storage medium 552, processor 544 may be configured to the functions, algorithms, and calculations described herein. Processor 544 may be embodied as a general purpose integrated circuit, an application specific integrated circuit, a field-programmable gate array, microprocessor, and other programmable logic devices. Processor 544 may further be configured to process communications received via communications interface 546 and monitored equipment interface 541. Monitored equipment interface 541 may be configured to receive status information from, and issue commands to a monitored equipment.

Computer-readable storage medium 552 may be the repository of various modules configured to perform any of the features described herein. According to the illustrated embodiment, computer-readable storage medium 552 comprises an FTP server module 560, a monitored equipment module 562, a user-accessible file system module 564, a communications module 566, an IED settings module 568, and an archive storage module 570.

FTP server module 560 may be configured to communicate with FTP client module 528. FTP server module 560 may facilitate the transfer of one or more files between computer 510 and IED 540. FTP server module 560 may further be in communication with user-accessible file system module 564, which may provide a file system in which a user may store and retrieve data files, including an archive file. According to one embodiment, computer-readable storage medium 552 may comprise a first portion, which is accessible to a user, by way of user accessible file system module 564. Further, computer-readable storage medium 552 may also comprise a second portion, which is not accessible to a user. The archive file and/or other data files stored on computer-readable storage medium 552 may be stored in the first portion of computer-readable storage medium 552.

Monitored equipment module 562 may be configured to receive input from monitored equipment interface 541. Monitored equipment module 562 may be configured to generate control instructions to be issued to monitored equipment, and may further be configured to store information received from monitored equipment interface 541. These modules and/or other modules of the IED may be used for protection, control, automation, and/or metering of the monitored equipment.

Communications module 566 may be configured to control communications between IED 540 and other devices, such as computer 510. Communications module 566 may interface with IED communications module 526 in order to send or receive IED settings. For example, communications module 566 may be configured to respond to a query from computer 510 for current IED settings. Communications module 566 may further facilitate the transfer of information accumulated by the monitored equipment interface 541 and/or monitored equipment module 562.

IED settings module 568 may be configured to implement the IED settings generated by design equations module 520. For example, IED settings module 568 may comprise a database of instructions that govern the operation of the IED 540 in a plurality of configurations. The appropriate instructions may be selected based upon the IED settings generated by design equations module 520.

Archive storage module 570 may be configured to store and retrieve an archive file. According to various embodiments, the archive file may be stored on a user accessible file system in cooperation with user accessible file system module 564. According to embodiments lacking a user accessible file system, storage and retrieval of the archive file may be accomplished by archive storage module 570.

Figure 6:
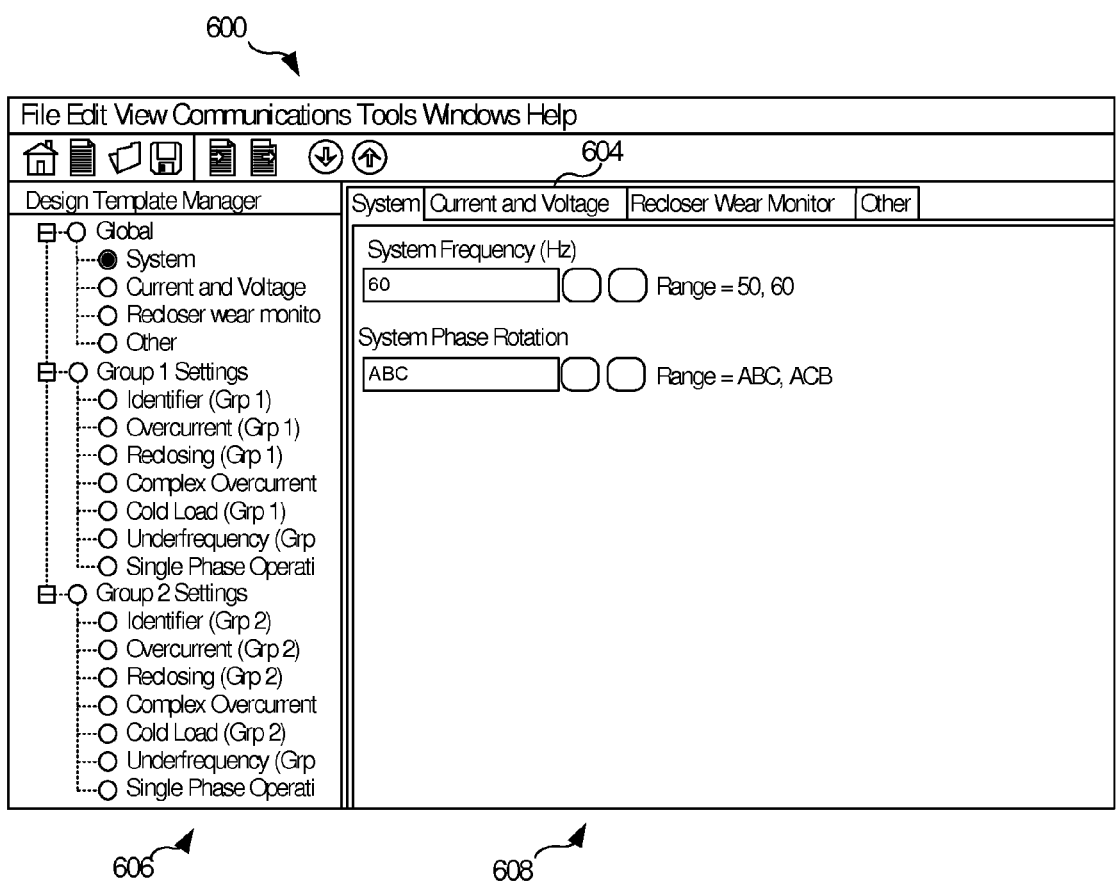
FIG. 6 illustrates a screen shot of one embodiment of a computer program that may allow a user to select a design template from a plurality of design templates and enter configuration information that may be used to generate IED settings and one or more archive file(s).

FIG. 6 illustrates a screen shot 600 of one embodiment of a computer program including a design template that may allow a user to enter configuration information that may be used to generate IED design settings and one or more archive file(s). A plurality of settings associated with the illustrated design template may be selected using tabs 604 or using a directory tree 606 in the Design Template Manager. A user may enter data using a template viewing area 608. Once a user has entered appropriate configuration data, the computer program may generate appropriate IED settings and an archive file containing the user input that was used to generate the IED settings. Further, the computer program may coordinate the transfer of the generated IED settings to the IED, together with the archive file. According to various embodiments, a computer program may comprise a plurality of design templates, although FIG. 6 illustrates a single design template.

Those having skill in the art will recognize that many changes may be made to the details of the above-described embodiments without departing from the underlying principles of the disclosure. The scope of the present invention should, therefore, be determined only by the following claims.

The invention claimed is:
1. A computer program product stored on a non-transitory computer readable medium having a plurality of instructions stored thereon which, when executed by a processor, cause the processor to:
  receive user input to a template;
  generate a first set of IED settings based on the user input to the template;
  transfer the first set of IED settings to an IED;
  generate an archive file comprising the user input to the template, and one or more of the template, logic equations utilized to generate IED settings, numeric equations utilized to generate the IED settings, generated IED settings, previous IED settings, and an indicator of the date and time that the first set of IED settings are created;
  establish communications with a file transfer protocol server resident on the IED; and
  transfer the archive file using a file transfer protocol to a computer-readable storage medium comprised by the IED;
  access the archive file;
  regenerate the first set of IED settings based on the archive file;
  store the regenerated first set of IED settings;

access a second set of IED settings the second set of IED settings comprising at least one setting that differs from the first set of IED settings;

compare the second set of IED settings to the regenerated first set of IED settings; and identify the at least one setting that differs between the second set of IED settings and the first set of IED settings.

2. The computer program product of claim 1, further comprising instructions stored thereon which, when executed by the processor, cause the processor to include additional files identified by a user in the archive file.

3. The computer program product of claim 1, further comprising instructions stored thereon which, when executed by the processor, cause the processor to store the archive file on a user-accessible portion of the computer-readable storage medium.

4. The computer program product of claim 1, further comprising instructions stored thereon which, when executed by the processor, cause the processor to generate the archive file, transfer the archive file to the IED, and store the archive file without user intervention.

* * * * *